United States Patent
Sumie et al.

[11] Patent Number: 5,943,437
[45] Date of Patent: Aug. 24, 1999

[54] METHOD AND APPARATUS FOR CLASSIFYING A DEFECT ON A SEMICONDUCTOR WAFER

[75] Inventors: Shingo Sumie; Tsutomu Morimoto; Yuichiro Gotoh; Eiji Takahashi, all of Kobe; Shouji Kanbe; Akira Okamoto, both of Hiranocho, all of Japan

[73] Assignees: Kabushiki Kaisha Kobe Seiko Sho, Kobe; Texas Instruments Japan Limited, Tokyo; KTI Semiconductor Ltd., Hyogo-ken, all of Japan

[21] Appl. No.: 08/725,950

[22] Filed: Oct. 7, 1996

[30] Foreign Application Priority Data

Oct. 9, 1995 [JP] Japan ................. 7-261150

[51] Int. Cl.$^6$ ................. G06K 9/00
[52] U.S. Cl. ................. 382/149; 382/145; 382/147
[58] Field of Search ................. 382/141, 144, 382/145, 147, 149, 150; 356/237, 394; 348/87, 101

[56] References Cited

U.S. PATENT DOCUMENTS 5,459,795  10/1995  Kawamura et al. ................ 382/147
5,544,256   8/1996  Brecher et al. ................... 382/149

Primary Examiner—Jose L. Couso
Assistant Examiner—Duy M. Dang
Attorney, Agent, or Firm—Hazel & Thomas, P.C.

[57] ABSTRACT

A surface image of a semiconductor wafer having a defect is picked up as a inspection image while a surface image of a semiconductor wafer having no defect is stored in an image memory as a reference image. A density difference image between the inspection image and the reference image. By extracting the defect in wiring and non-wiring regions from the density difference image, extract images are obtained. Two luminance information for wiring and non-wiring regions are obtained from extract images. Based on the luminance information, the type of the defect is determined and a production process where the defect has occurred is detect.

14 Claims, 15 Drawing Sheets

FIG. 10

IDe

| 0 | 0 | 0 | 0 | 0 | 0 |
|---|---|---|---|---|---|
| 0 | 0 | 0 | 0 | 0 | 0 |
| 0 | 0 | 0 | 1 | 1 | 1 |
| 0 | 0 | 1 | 1 | 1 | 1 |
| 0 | 1 | 1 | 1 | 1 | 1 |
| 0 | 1 | 1 | 1 | 1 | 1 |
| 0 | 1 | 1 | 1 | 1 | 1 |
| 0 | 1 | 1 | 1 | 1 | 1 |

FIG. 11

IDf

| 1 | 1 | 1 | 1 | 1 | 1 |
|---|---|---|---|---|---|
| 1 | 1 | 1 | 1 | 1 | 1 |
| 0 | 0 | 0 | 0 | 0 | 0 |
| 0 | 0 | 0 | 0 | 0 | 0 |
| 0 | 0 | 0 | 0 | 0 | 0 |
| 0 | 0 | 0 | 0 | 0 | 0 |
| 0 | 0 | 0 | 0 | 0 | 0 |
| 0 | 0 | 0 | 0 | 0 | 0 |

FIG. 12

IDg

| 0 | 0 | 0 | 0 | 0 | 0 |
|---|---|---|---|---|---|
| 0 | 0 | 0 | 0 | 0 | 0 |
| 1 | 1 | 1 | 1 | 1 | 1 |
| 1 | 1 | 1 | 1 | 1 | 1 |
| 1 | 1 | 1 | 1 | 1 | 1 |
| 1 | 1 | 1 | 1 | 1 | 1 |
| 1 | 1 | 1 | 1 | 1 | 1 |
| 1 | 1 | 1 | 1 | 1 | 1 |

METHOD AND APPARATUS FOR CLASSIFYING A DEFECT ON A SEMICONDUCTOR WAFER

BACKGROUND OF THE INVENTION

The present invention relates to a method and an apparatus for classifying a defect on a semiconductor wafer.

Generally, in a process for fabricating an integrated circuit on a semiconductor wafer, it is known that the attachment of dust carried into a clean room and particles produced in an apparatus for fabricating the integrated circuit to the semiconductor wafer can have a disastrous effect on a yield and product quality. Besides the dust and the particles produced in the apparatus, an abnormal region created on the semiconductor wafer by implementing the production process without eliminating the dust and the particles can be included as a factor which renders a bad effect. Hereafter, all factors which bring about a reduced yield and a reduced product quality are referred to as "defects" in order to simplify the description.

In order to reduce such defects, it has been desired that the type of the defect be distinguished and that a suitable operation be adapted to prevent an occurrence of the defect in the production process where the defect has occurred. Known apparatuses for classifying a defect on a semiconductor wafer include, for example, an apparatus A0 disclosed in Japanese Examined Patent Publication FIG. 1 is a block diagram of the defect classifying apparatus A0, and FIG. 2 is a diagram showing the operation of the apparatus A0 of FIG. 1. As shown in FIG. 1, the apparatus A0 is provided with a camera 52 for picking up an image of the surface of a semiconductor wafer 51 as an object to be inspected. The camera 52 is electrically connected with an analog-to-digital (A/D) converter 53. A surface image I of the semiconductor wafer 51 picked up by the camera 52 (hereinafter, "inspection image") is converted into a digital signal, and is inputted into a comparator 54b of a defect region extraction circuit 54. In this manner, multi-gradation image data of the inspection image (hereinafter, "inspection image data") is fed to the comparator 54b.

The defect region extraction circuit 54 includes an image memory 54a in which multi-gradation image data (hereinafter, "reference image data") corresponding to a surface image I0 (hereinafter, "reference image") of a semiconductor wafer having no defect is stored in advance. The reference image data is fed from the image memory 54a to the comparator 54b. When the reference image data and the inspection image data are input to the comparator 54b in this way, both image data are compared pixel by pixel to generate defect region extraction data (binary image data) in which "1" denotes a defect region and "0" denotes a region other than the defect region. The defect region extraction data is fed to a geometric feature extraction circuit 55. It should be noted that B1 in FIG. 2 identifies a defect region extraction image obtained based on the defect region extraction data.

The circuit 55 includes an image memory 55a for temporarily storing the defect region extraction data, an image memory 55b for storing pattern data, and a computer 55c. The "pattern data" is such that the reference image is divided into a plurality of wiring partial regions R (FIG. 2) which are coded so as to be distinguishable from each other. In this example, the wiring partial regions are classified into three patterns: "0", "1", and "2". The computer 55c reads the defect region extraction data from the image memory 55a and the pattern data from the image memory 55b, and compares both read data, thereby calculating areas S0, S1, S2 taken up by the respective patterns "0", "1", and "2" within the defect region (a hatched region in the defect region extraction image BI) as feature parameters concerning the defect region and feeding them to a defect classification computer 56.

The computer 56 classifies the defect based on the feature parameters obtained as above. In other words, the computer determines whether the wiring has peaking, lacking or fault defects in the defect region by comparing the areas S0, S1, S2 with each other.

As described above, the prior art defect classifying apparatus A0 classifies the defect based on the defect region extraction data (binary image data). In this respect, the defect classifying method adopted by this apparatus A0 can be said to be a defect classifying method which bases only the geometric information such as the area, width and peripheral length of the defect. In other words, the apparatus A0 can only determine the type of the defect as the pecking, lacking and fault of the wiring, but cannot detect in which production process the defect has occurred. Accordingly, with the prior art apparatus A0, it is impossible to specify the production process where the defect has occurred and to improve this production process.

Further, since the pattern data are stored in the image memory in advance, all pattern data of the partial regions used for the defect classification need to be stored. As a result, the image memory 55b is disadvantageously required to have a huge memory capacity.

SUMMARY OF THE INVENTION

It is an object of the present invention to provide defect classifying method and apparatus for a semiconductor wafer which is capable of not only determining the type of a defect that has occurred in a process for producing an integrated circuit on the semiconductor wafer, but also detecting the production process where the defect has occurred.

The present invention is directed to a method of and an apparatus for classifying a defect on a semiconductor wafer including wiring and non-wiring regions. The method comprises the steps of: picking up a surface image of a semiconductor wafer having a defect as a inspection image, the surface image including images of the wiring and non-wiring regions; obtaining a first information with respect to luminance or light intensity of the wiring region from the inspection image; obtaining a second information with respect to luminance or light intensity of the non-wiring region from the inspection image; and classifying the defect based on the first and second information. The apparatus comprises: means for picking up a surface image of a semiconductor wafer having a defect as a inspection image, the surface image including images of the wiring and non-wiring regions; means for obtaining a first information with respect to luminance or light intensity of the wiring region from the inspection image; means for obtaining a second information with respect to luminance or light intensity of the non-wiring region from the inspection image; and means for classifying the defect based on the first and second information.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 10 and 15 are diagrams showing a part of a defect mask image data;

FIG. 11 is a diagram showing a part of a wiring mask image data;

FIG. 12 is a diagram showing a part of a non-wiring mask image data;

DESCRIPTION OF THE PREFERRED EMBODIMENTS OF THE INVENTION

Prior to the description of defect classifying method and apparatus according to the invention, defect occurring mechanism during the production of an integrated circuit on semiconductor wafer is briefly described.

Figure 1:
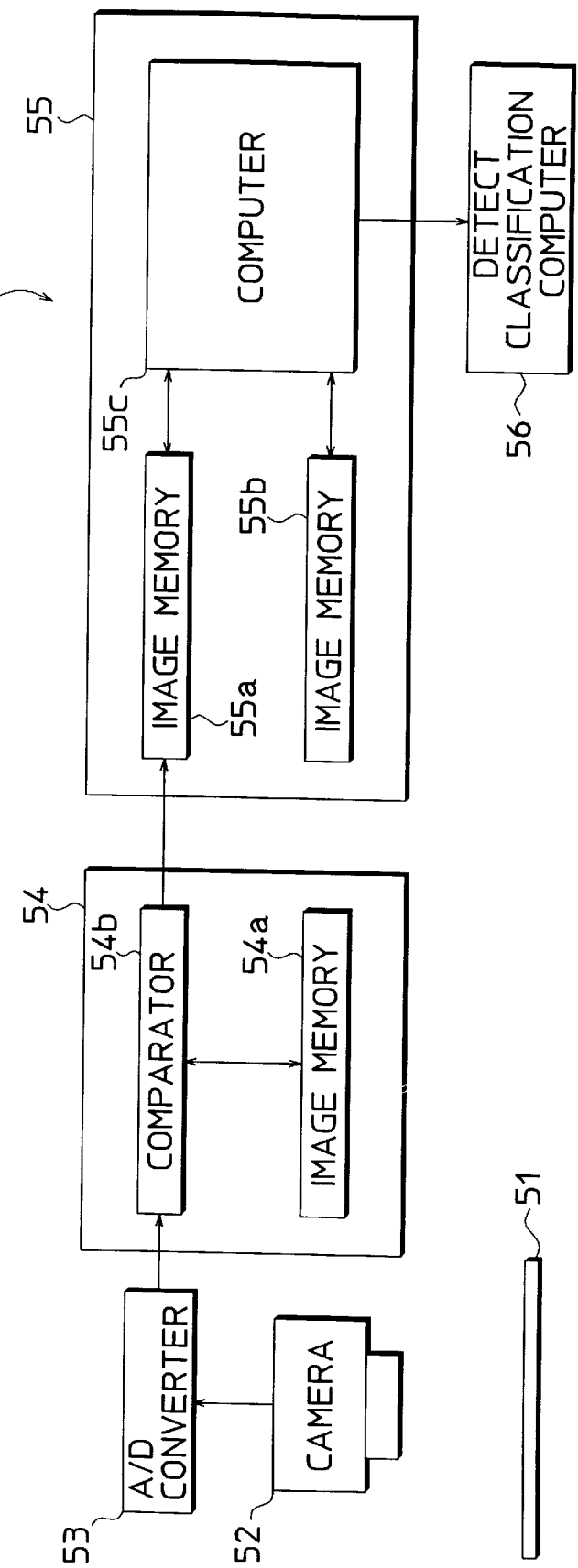
FIG. 1 is a block diagram of a prior art defect classifying apparatus.
Figure 2:
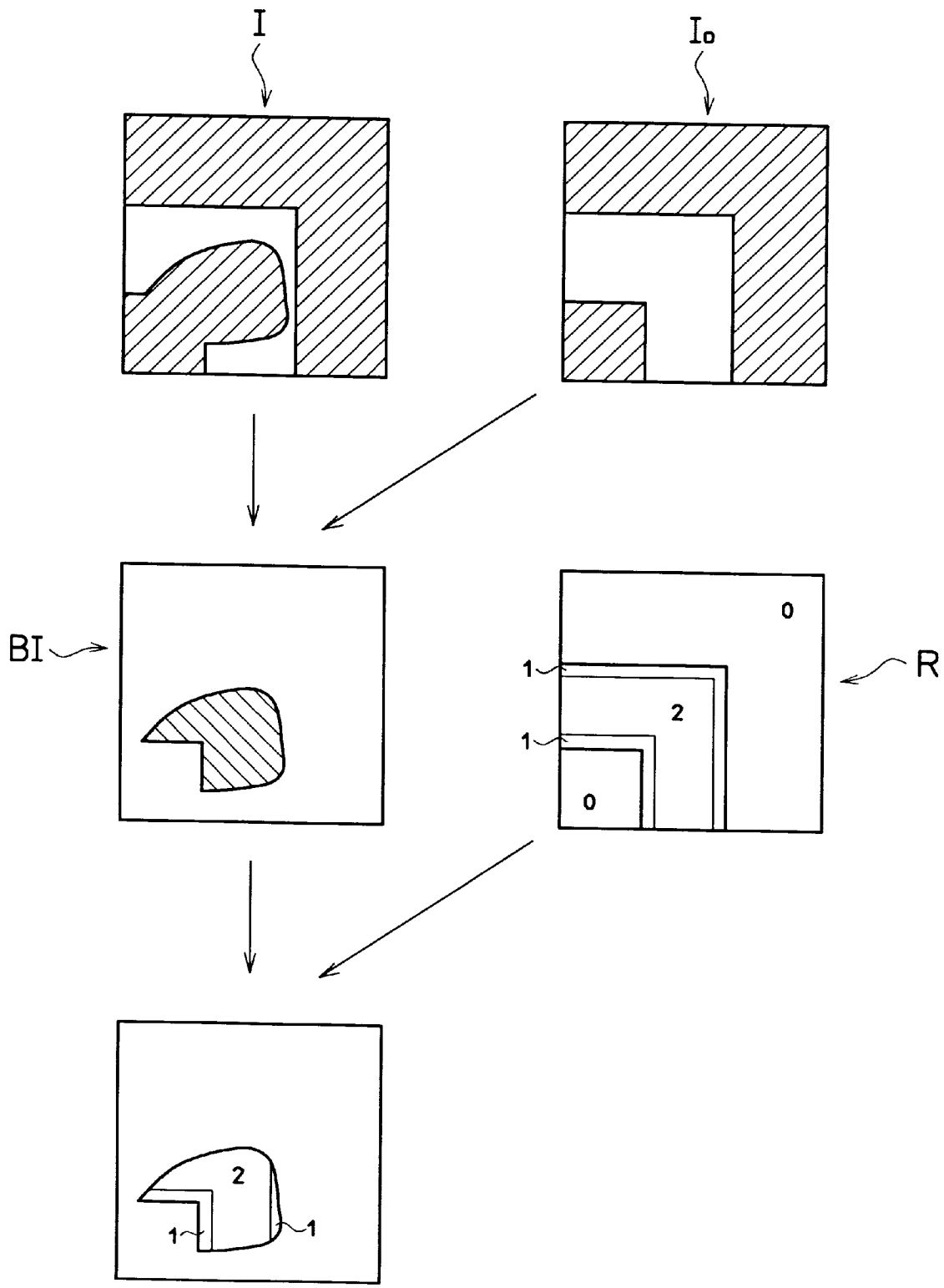
FIG. 2 is a diagram showing the operation of the apparatus of FIG. 1.
Figure 3A:
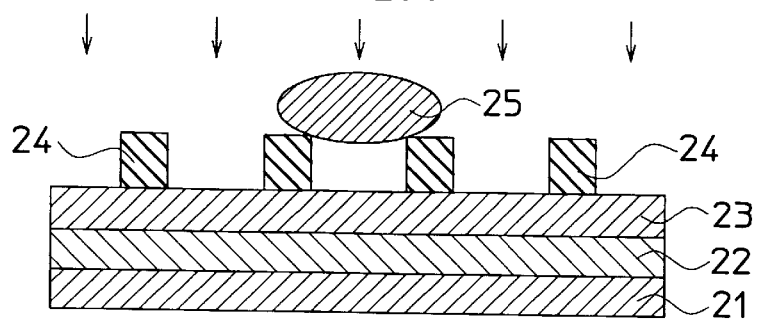
FIGS. 3A and 3B are diagrams showing an exemplary production process of an integrated circuit.
Figure 3B:
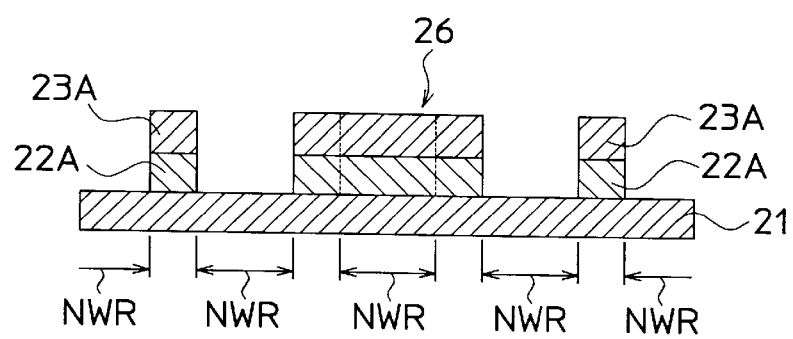

FIGS. 3A and 3B are diagrams showing an exemplary production process of an integrated circuit. In FIG. 3A, wiring layers 22, 23 are formed in this order on an insulation layer 21. In order to form a wiring portion having a specified configuration on the wiring layers 22, 23 by patterning operation, a resist layer 24 having a configuration conforming to that of the wiring is formed on the wiring layer 23. Etching operation is applied using the patterned resist layer 24 as an etching mask to simultaneously pattern the wiring layers 22, 23, thereby forming wiring portions 22A, 23A. If a extraneous material 25 such as a dust is deposited on the patterned resist layer 24 during the etching operation as shown in FIG. 3A, the extraneous material 25 functions as an etching mask, with the result that a wiring region corresponding to the extraneous material 25 is not etched and remains as shown in FIG. 3B. In this way, a wiring portion 26 (=22A+23A) appears as a defect despite the fact it is a region (hereinafter, "non-wiring region") NWR where the wiring should not be formed in circuit design.

Figure 4A:
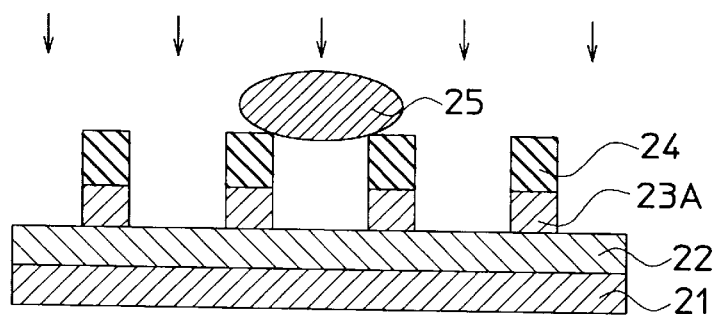
FIGS. 4A and 4B are diagrams showing another exemplary production process of an integrated circuit.
Figure 4B:
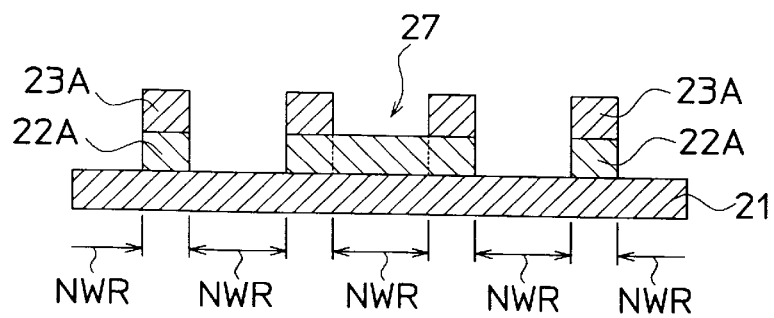

FIGS. 4A and 4B are diagrams showing another exemplary production process of an integrated circuit. In FIG. 4A, a wiring layer 22, an already patterned wiring portion 23A and an already patterned resist layer 24 are formed in this order on an insulation layer 21. Etching operation is applied using the patterned resist layer 24 as an etching mask to form a wiring portion 22A in the wiring layer 22 by patterning operation. If extraneous material 25 such as dust is deposited on the resist layer 24 during the etching operation as shown in FIG. 4A, it functions as an etching mask, with the result that a wiring region 27 (22A) corresponding to the extraneous material 25 is not etched and remains as shown in FIG. 4B. In this way, the wiring portion 27 appears as a defect despite the fact that it is a non-wiring region NWR in circuit design.

Figure 5A:
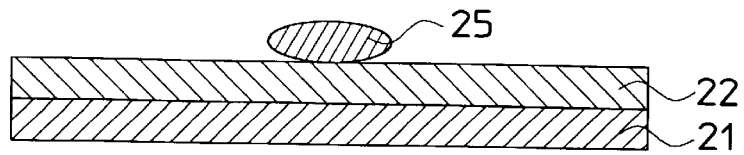
FIGS. 5A to 5D are diagrams showing still another exemplary production process of an integrated circuit.
Figure 5B:
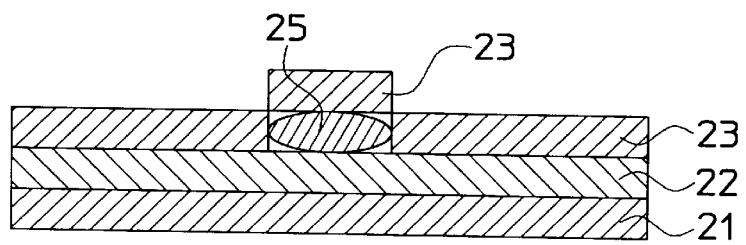
Figure 5C:
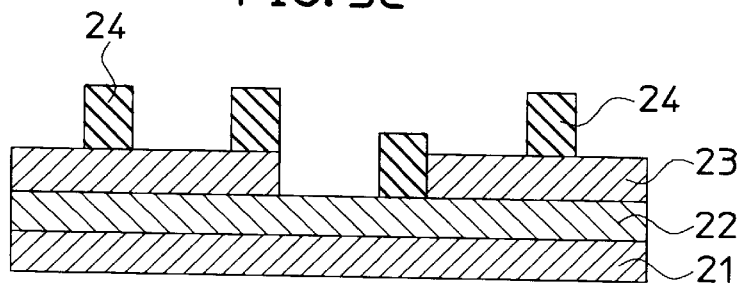
Figure 5D:
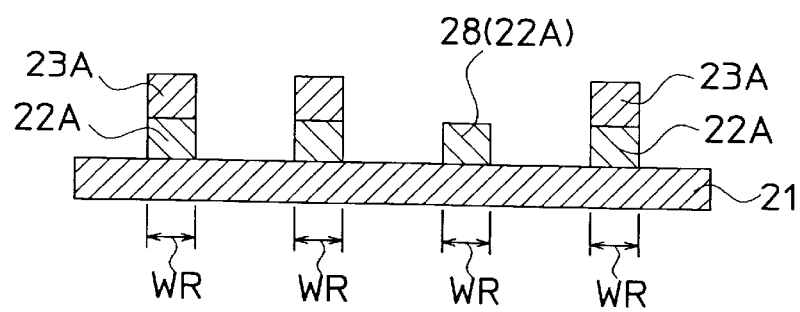

FIGS. 5A to 5D are diagrams showing still another exemplary production method of an integrated circuit. In FIG. 5A, a wiring layer 22 is formed on an insulation layer 21. If extraneous material 25 is on the wiring layer 22 when another wiring layer 23 is formed on the wiring layer 22, the wiring layers 23 are formed separately on the wiring layer 22 and the extraneous material 25. Thus, the wiring layer 23 on the extraneous material 25 peels off together with the extraneous material 25 and the patterned resist layer 24 is then formed on the wiring layers 22, 23 as shown in FIG. 5C. Thereafter, etching is applied using the patterned resist layer 24 as an etching mask to form wiring portions 22A, 23A in the wiring layers 22, 23 by patterning operation. As a result, as shown in FIG. 5D, the wiring portion 23A does not exist where there was the extraneous material 25 despite the fact that it is a region where the wiring should be formed (hereinafter, "wiring region") WR, and a defect 28 that the wiring portion 22A is exposed appears.

As described above, the defects differ depending upon the production process. However, the defect classifying apparatus and method described below are capable of not only determining the type of the defects, but also detecting in which production process these defects have occurred.

Figure 6:
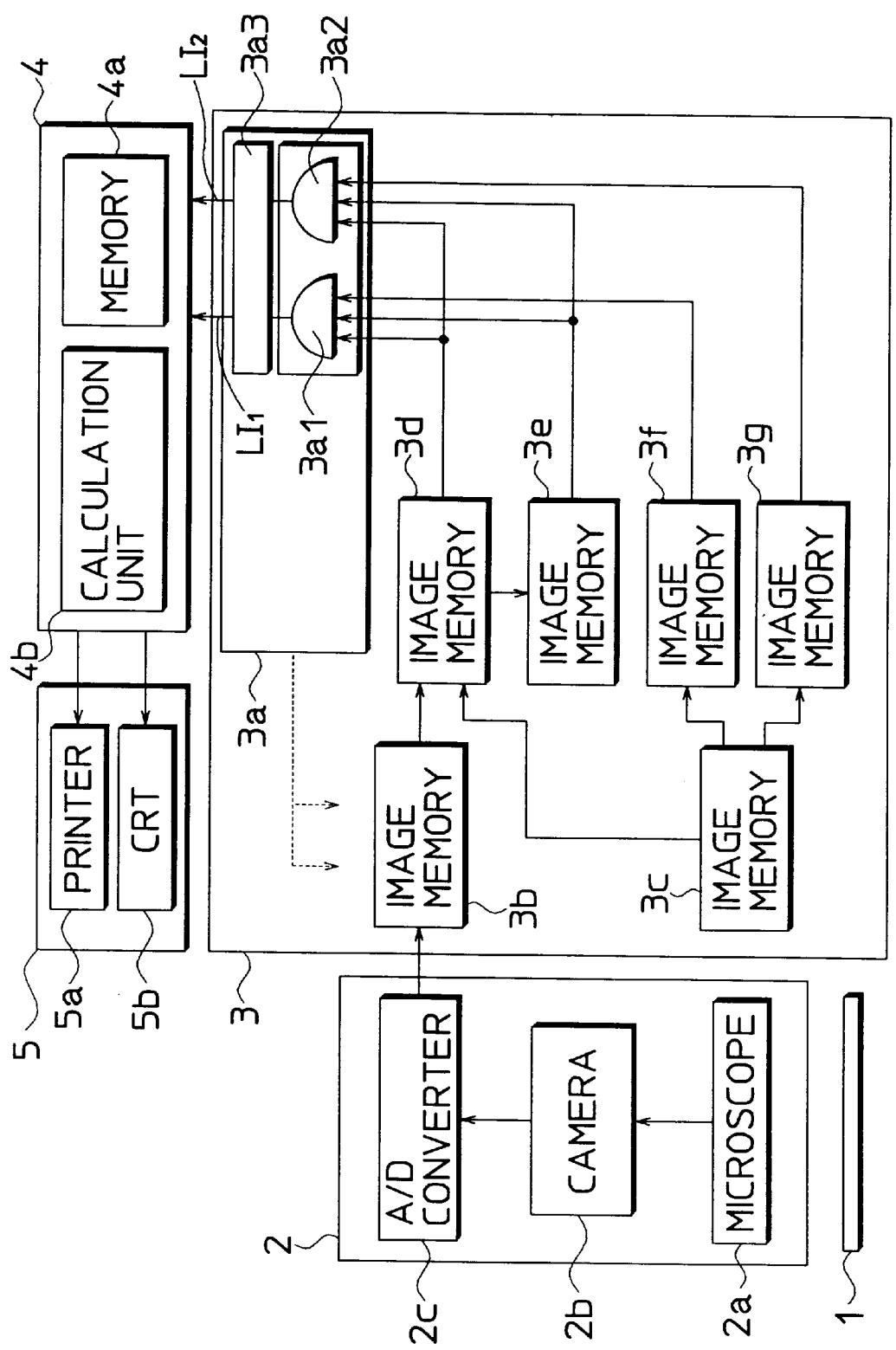
FIG. 6 is a block diagram of one embodiment of a defect classifying apparatus according to the invention.

FIG. 6 is a block diagram showing one embodiment of the defect classifying apparatus according to the invention. A defect classifying apparatus A is mainly provided with an image pickup device 2 including a microscope 2a, a camera 2b and an analog-to-digital (A/D) converter 2c, an image processor 3 for applying specified processing to an image to extract a necessary information, a computer 4 for classifying the type of a defect based on luminance information outputted from the image processor 3, and an output device 5 including a printer 5a and a cathode ray tube (CRT) 5b.

In the image pickup device 2, a surface of a semiconductor wafer 1 to be inspected is magnified by the microscope 2a and the magnified image, i.e., inspection image is picked up by the camera 2b. The thus picked up inspection image is converted into a digital signal by the A/D converter 2c and is fed to the image processor 3 as multi-gradation (e.g. 256 gradation levels of from level "0" to level "255") image data (inspection image data). It should be noted that the gradation levels associated with the luminance is determined by the resolving power of the A/D converter 2c.

The image processor 3 includes an image processing circuit 3a for implementing image processing to be described below and six image memories 3b to 3g. Out of the image memories 3b to 3g, the image memory 3b temporarily stores the inspection image data from the image pickup device 2, and the reference image data is stored in advance in the image memory 3c. The remaining image memories 3d to 3g are adapted to store the image data obtained by the image processing in the image processing circuit 3a.

The computer 4 includes a memory 4a in which preselected classification data are stored and a calculation unit 4b. The computer 4 receives two kinds of luminance information $LI_1$ and $LI_2$ output from the image processor 3, and compares them with the classification data stored in the memory 4a so as to determine what type of defect has occurred and in which production process the defect has occurred. The determination results are fed to the output device 5.

Next, the operation of the defect classifying apparatus A constructed as above is described separately with respect to a case where the defect 26 shown in FIGS. 3A and 3B has occurred and a case where the defect 28 shown in FIGS. 5A to 5D has occurred.

(Case Where the Defect 26 Has Occurred)

Figure 7:
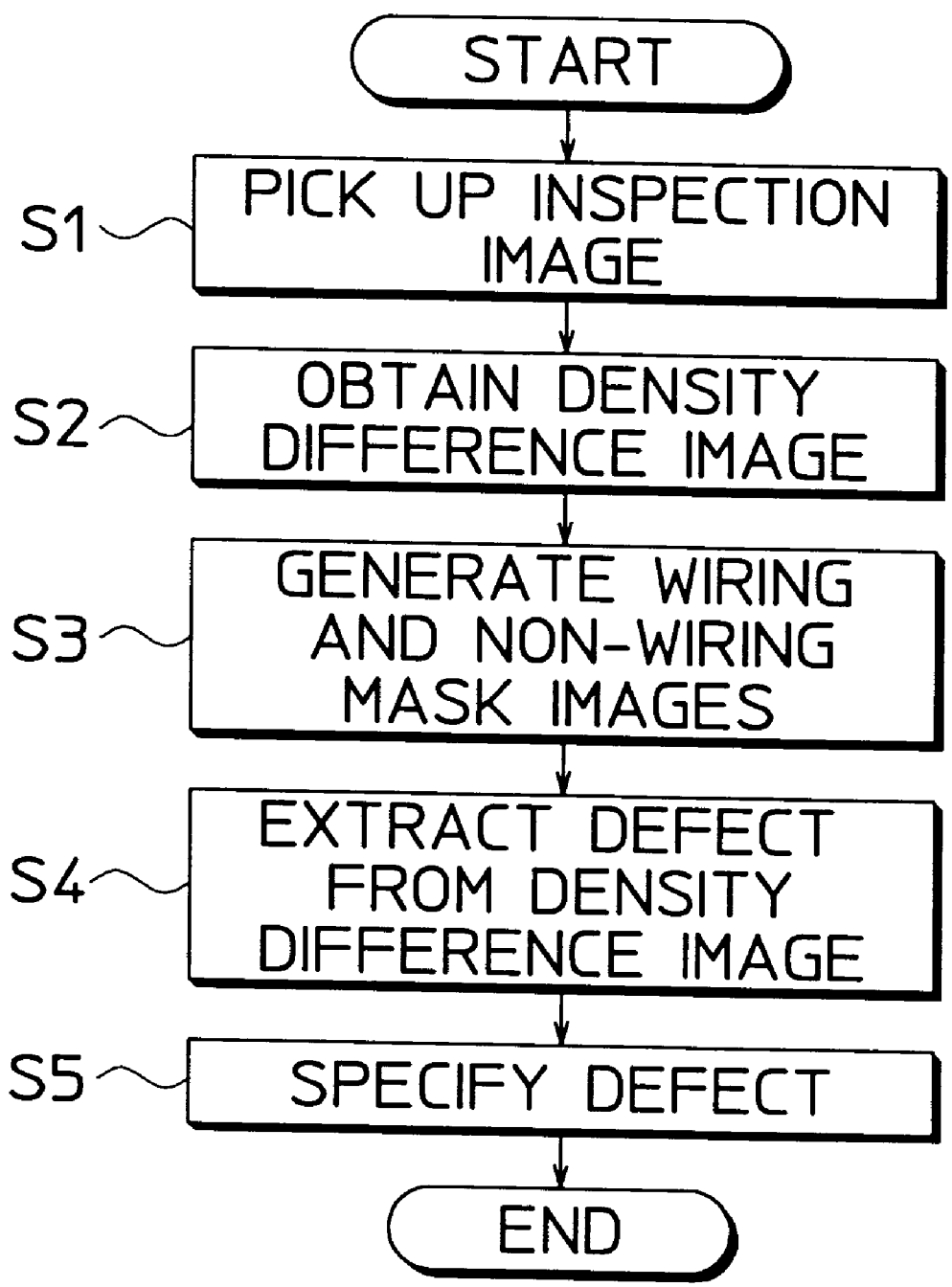
FIG. 7 is a flow chart showing the operation of the apparatus of FIG. 6.
Figure 8:
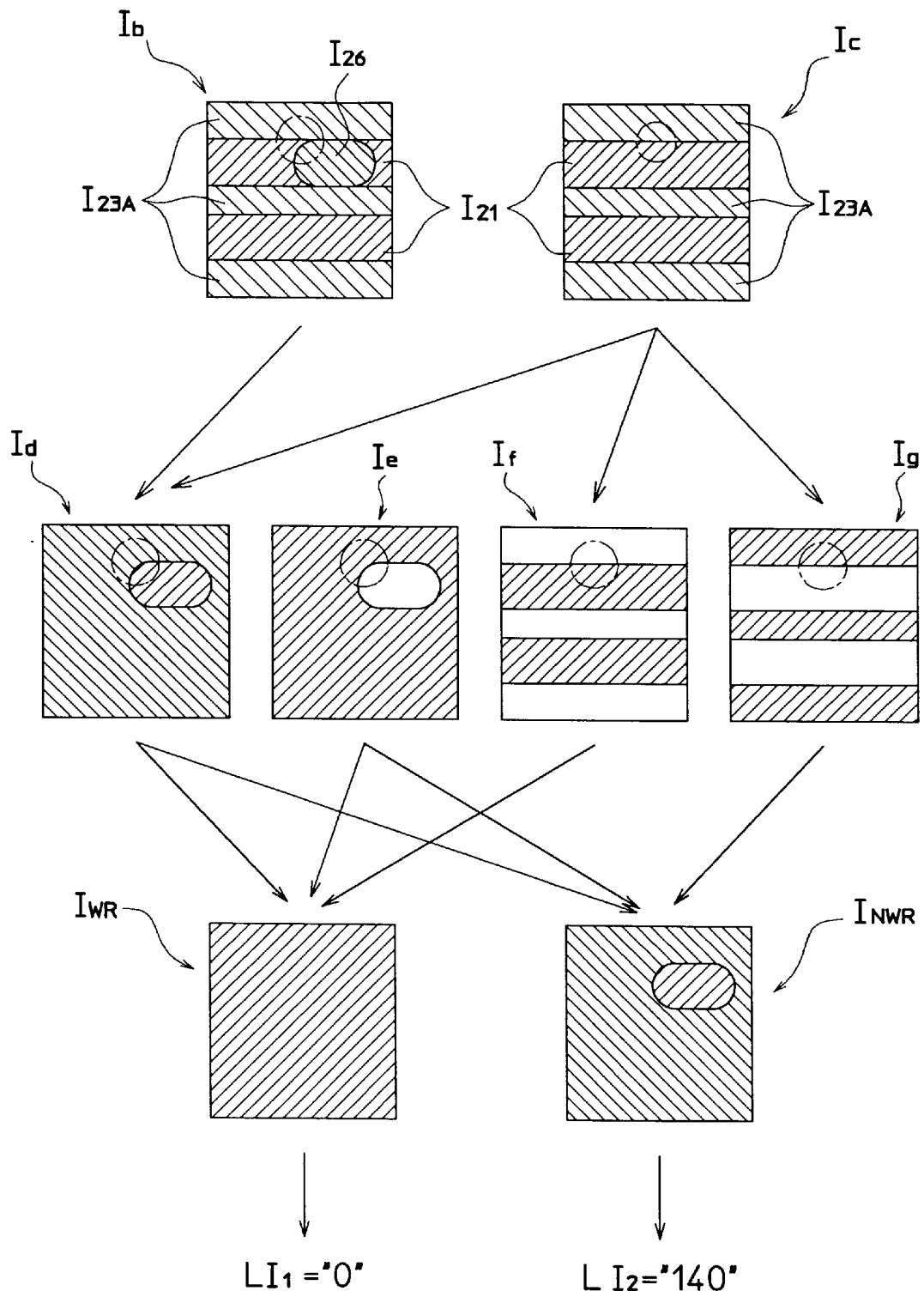
FIGS. 8 and 13 are diagrams showing the operation of the apparatus of FIG. 6.

FIG. 7 is a flow chart showing the operation of the defect classifying apparatus A, and FIG. 8 is a diagram showing this operation. It should be appreciated that the line spacing in hatched regions in FIG. 8 and FIGS. 13, 16, 17 and 18 to be described below relatively represents the luminance level, and that the wider the line spacing, the higher the luminance level.

In this apparatus A, after the semiconductor wafer 1 to be inspected is set in a specified position, the surface of the semiconductor wafer 1 is sensed by the image pickup device 2, i.e. the inspection image is picked up, and the inspection image data of the inspection image is stored in the image memory 3b (Step S1). The thus picked up inspection image $I_b$ is comprised of images $I_{23A}$ of the wiring portion 23A existing in the wiring region WR (see FIG. 5), images $I_{21}$ of the insulation layer 21 existing in the non-wiring region NWR (see FIG. 3B), and an image $I_{26}$ of the defect 26 existing in the non-wiring region NWR.

Figure 9:
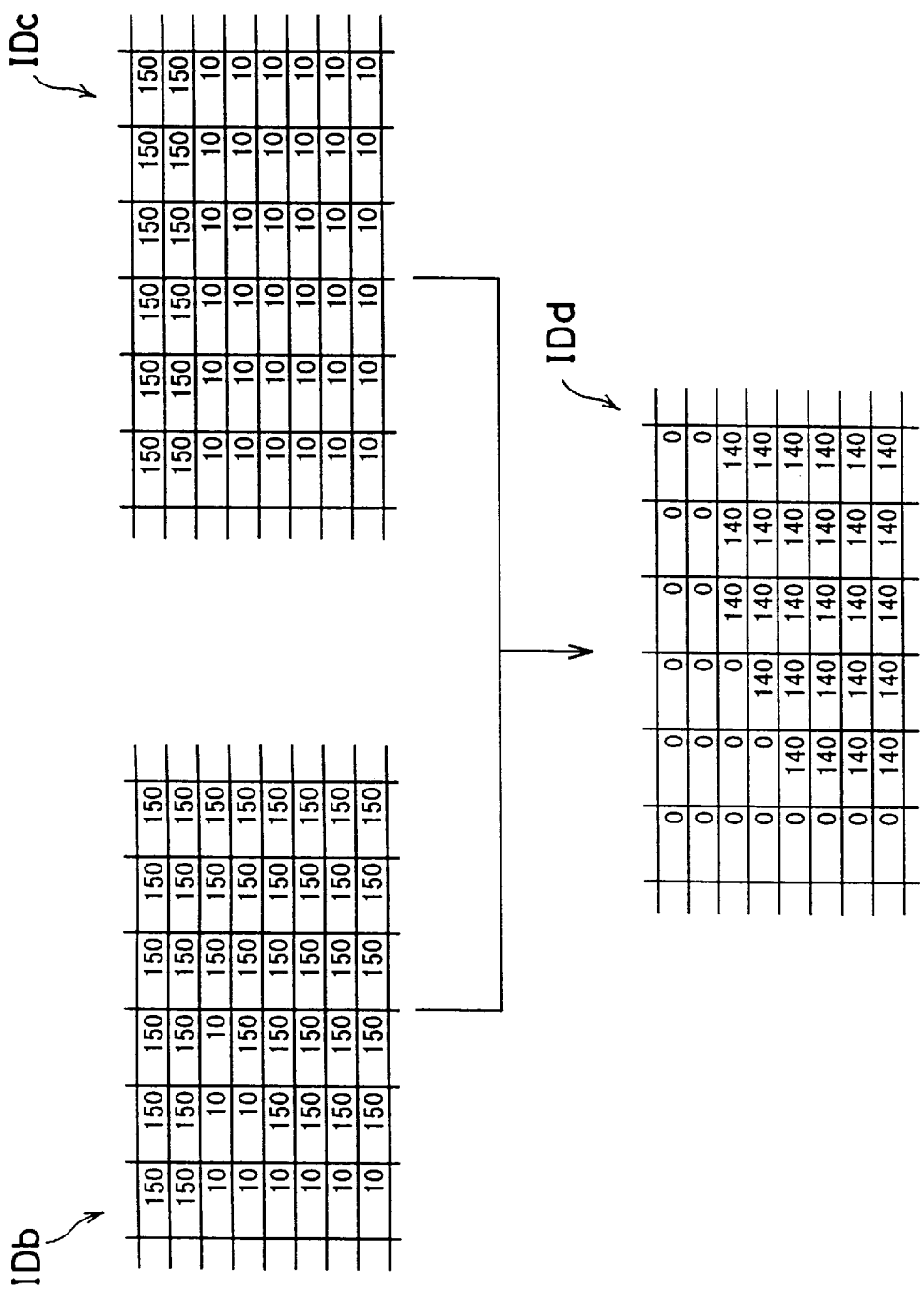
FIGS. 9 and 14 are diagrams showing a method for generating a density difference image.

Next, in Step S2, the inspection image data is read from the image memory 3b, the reference image data representative of a reference image $I_c$ is read from the image memory 3c, and the luminance level difference is calculated pixel by pixel by the image processing circuit 3a so as to obtain a density difference image $I_d$ of the images $I_b$, $I_c$. Specifically, as shown in FIG. 9, the image data $ID_b$, $ID_c$ stored in the memories 3b, 3c are comprised of the luminance level ("0" to "255") in each pixel constructing the image. By reading both image data pixel by pixel, calculating their difference, and storing the calculated difference in the image memory 3d, the image data $ID_d$ the density difference image $I_d$ is obtained. When there is a displacement between the inspection image $I_b$ and the reference image $I_c$, a displacement amount is obtained by performing a normal correlation prior to the generation of the density difference image $I_d$. The positions may be corrected by moving the inspection image $I_b$ relative to the reference image $I_c$ by the displacement amount.

Further, by converting the density difference image $I_d$ into binary data based on a suitable threshold value and applying basic image processing such noise removal, the image is stored in the image memory 3e while the pixel data corresponding to the defect 26 are set to "1" and the data of the pixels other than the defect pixels are set to "0" (see FIG. 10). The thus formed defect mask image $I_e$ functions as a defect mask to be described below.

Next, in Step S3, images $I_f$, $I_g$ representative of the wiring region WR and the non-wiring region NWR are generated separately from the reference image. More specifically, the reference image data $ID_c$ stored in the image memory 3c is read, converted into binary data based on a suitable threshold value, and subjected to noise removal so as to generate a wiring mask image $I_f$ by setting the pixel data corresponding to the wiring region WR to "1" and setting the pixel data corresponding to the non-wiring region NWR to "0". Conversely, by setting the pixel data corresponding to the wiring region WR to "0" and setting the pixel data corresponding to the non-wiring region NWR to "1", a non-wiring mask image $I_g$ is generated. A non-wiring mask image data $ID_g$ (see FIG. 12) may be formed by applying an NOT operation to a wiring mask image data $ID_f$ (see FIG. 11).

In Step S4, a wiring mask processing is applied by a defect extraction circuit 3a1 for the wiring region to extract the defect in the wiring region WR. Specifically, the density difference image data $ID_d$, the defect mask image data $ID_e$ and the wiring mask image data $ID_f$ are read from the image memories 3d, 3e, 3f, respectively. The luminance level of the density difference image data $ID_d$ is output pixel by pixel as it is if the defect mask image data $ID_e$ and the wiring mask image data $ID_f$ are both "1". Unless otherwise, the luminance level of the density difference data $ID_d$ is output while being set to "0". Accordingly, in the case that the defect 26 is included, the luminance level of the pixels constructing an extract image $I_{WR}$ obtained by the above wiring mask processing are all "0".

Further, non-wiring mask processing is applied by a defect extraction circuit 3a2 for the non-wiring region to extract the defect in the non-wiring region NWR. Specifically, the density difference image data $ID_d$, the defect mask image data $ID_e$ and the non-wiring mask image data $ID_g$ are read from the image memories 3d, 3e, 3g, respectively. The luminance level of the density difference image data $ID_d$ is outputted pixel by pixel as it is if the defect mask image data $ID_c$ and the non-wiring mask image data $ID_g$ are both "1". Unless otherwise, the luminance level of the density difference image data $ID_d$ is output while being set to "0". Accordingly, in the case that the defect 26 is included, the luminance level of the pixels corresponding to the defect 26 is "140" and that of the other pixels constructing an extract image $I_{NWR}$ obtained by the above non-wiring mask processing is "0".

The data of the thus obtained extract images $I_{WR}$, $I_{NWR}$ are fed to a luminance calculation unit 3a3 in which average luminance levels in the defect region of the extract image $I_{WR}$ obtained by the wiring mask processing and the extract image $I_{NWR}$ obtained by the non-wiring mask processing are calculated. The calculation results "0", "140" are output to the computer 4 as the pieces of luminance information $LI_1$, $LI_2$.

In Step S5, a calculation unit 4b of the computer 4 compares two kinds of the luminance information $LI_1$, $LI_2$ and the classification data stored in the memory 4a, specifies the defect 26 having occurred in the production process shown in FIGS. 3A and 3B, and notifies the printer 5a and the CRT 5b that the defect 26 has occurred in the production process shown in FIGS. 3A and 3B.

(Case Where the Defect 28 Has Occurred)

Figure 13:
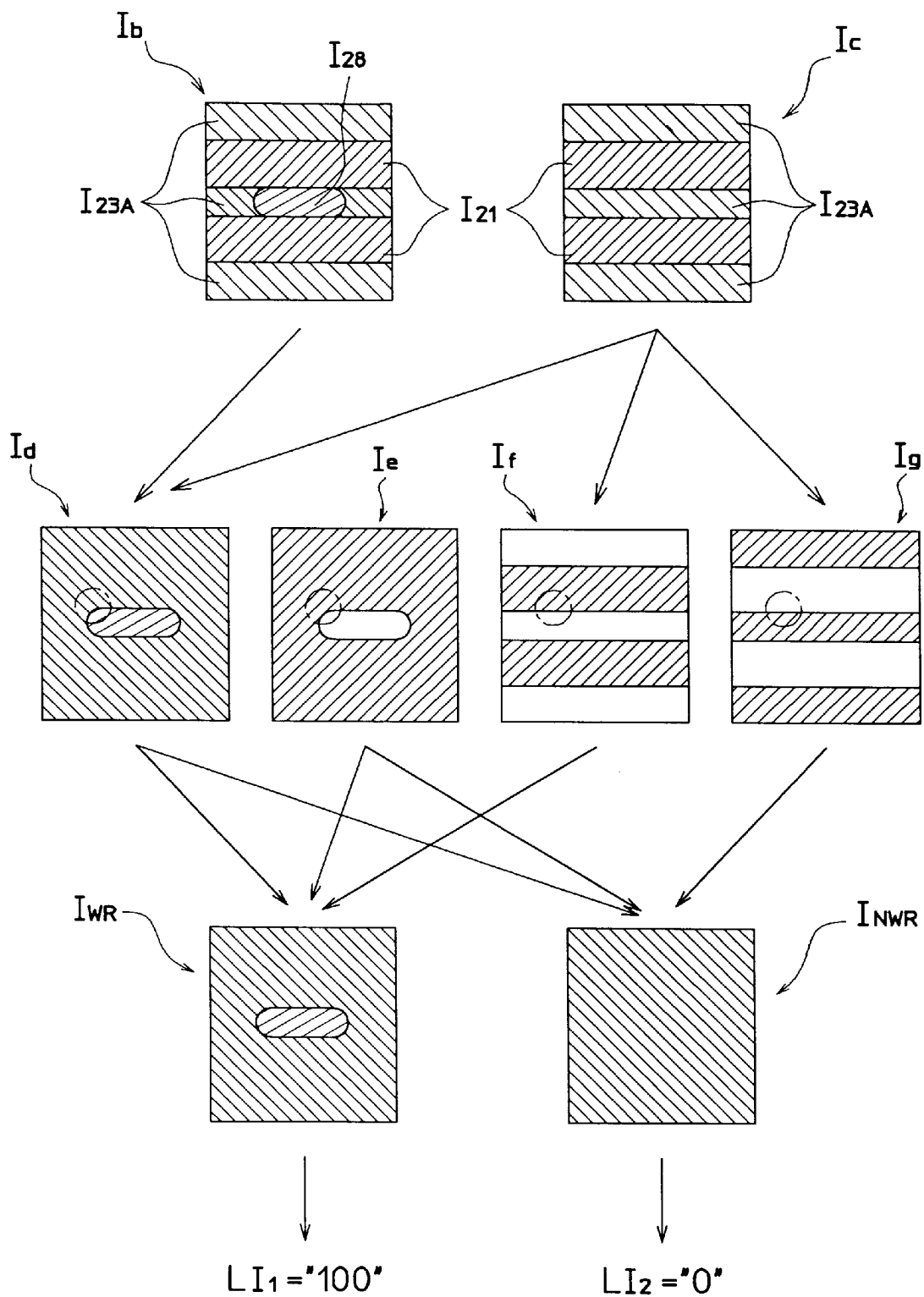
Figure 14:
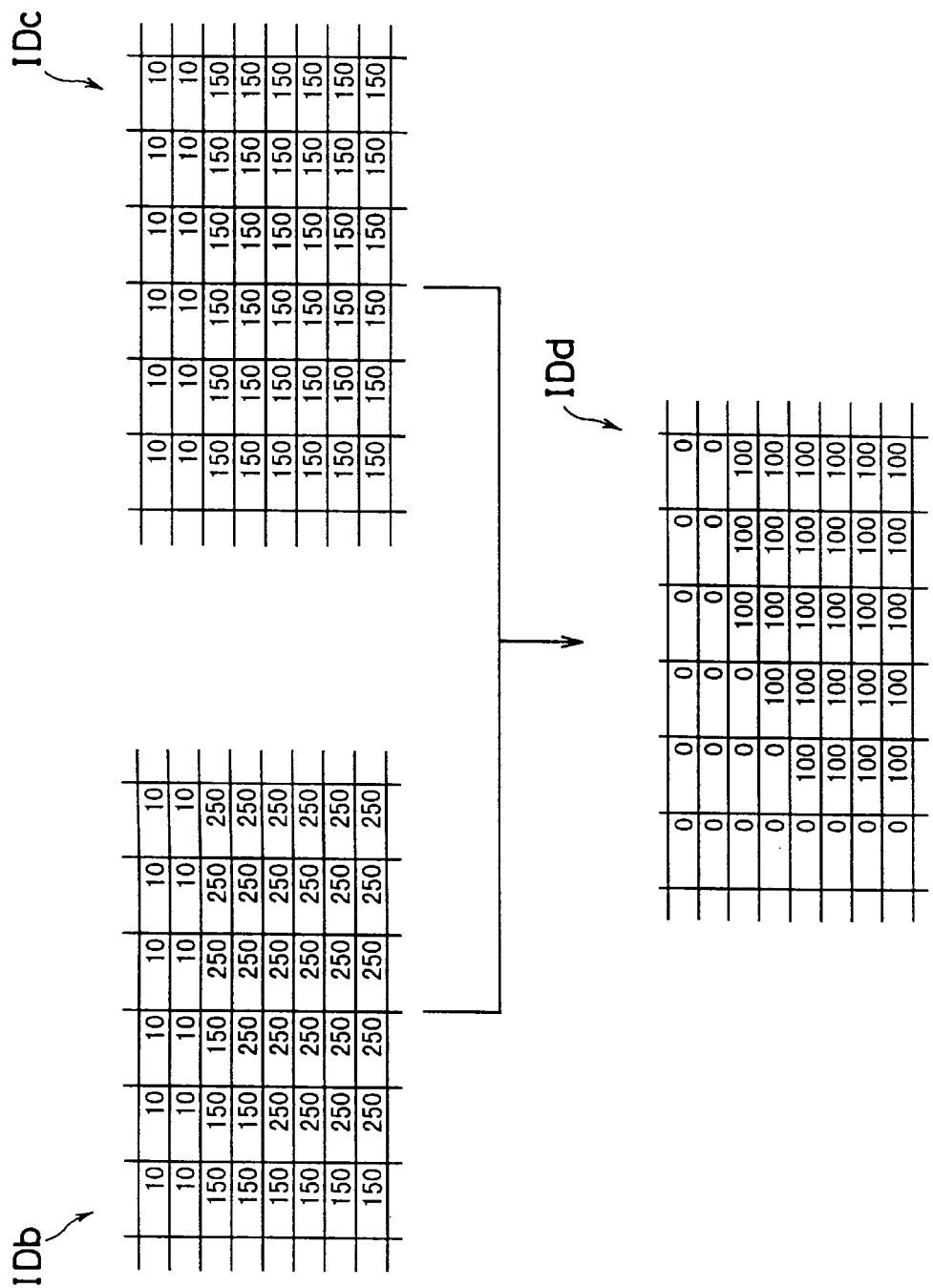

Next, the case where the defect 28 has occurred is described with reference to FIGS. 13 to 15.

After the semiconductor wafer 1 having the defect 28 is set in a specified position, the surface of the semiconductor wafer 1 is sensed by the image pickup device 2, i.e. the inspection image is picked up, and the inspection image data of the inspection image is stored in the image memory 3b (Step S1). The thus picked up inspection image $I_b$ is, as shown in FIG. 13, comprised of images $I_{23A}$ of the wiring portion 23A existing in the wiring region WR, images $I_{21}$ of the insulation layer 21 existing in the non-wiring region NWR, and an image $I_{28}$ of the defect 28 existing in the wiring region WR.

Next, in Step S2, the inspection image data is read from the image memory 3b, the reference image data representative of the reference image $I_c$ is read from the image memory 3c, and the luminance level difference is calculated pixel by pixel by the image processing circuit 3a so as to obtain the density difference image $I_d$ of the images $I_b$, $I_c$. Specifically, as shown in FIG. 14, the image data $ID_d$ of the density difference image $I_d$ is formed by reading the image data $ID_b$, $ID_c$ stored in the memories 3b, 3c, calculating their difference, and storing the calculated difference in the image memory 3d. In the case that there is a displacement between the inspection image $I_b$ and the reference image $I_c$, the position correction is performed in the same manner as described above so as to improve a classification accuracy.

Figure 15:
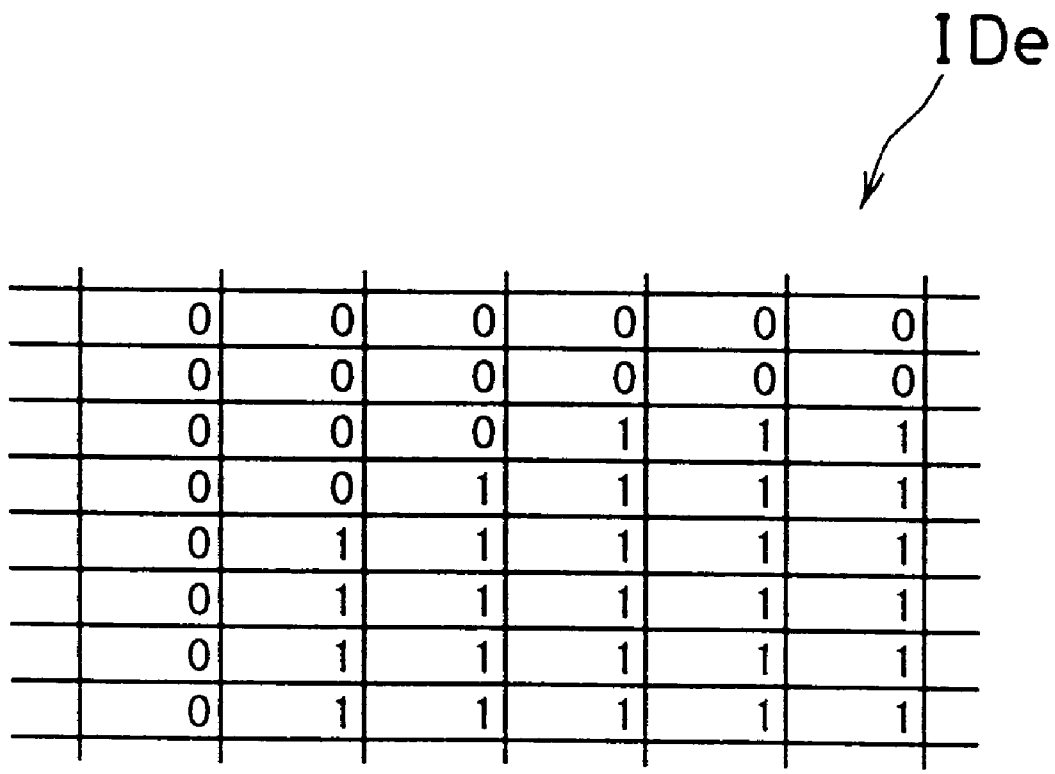
Figure 16:
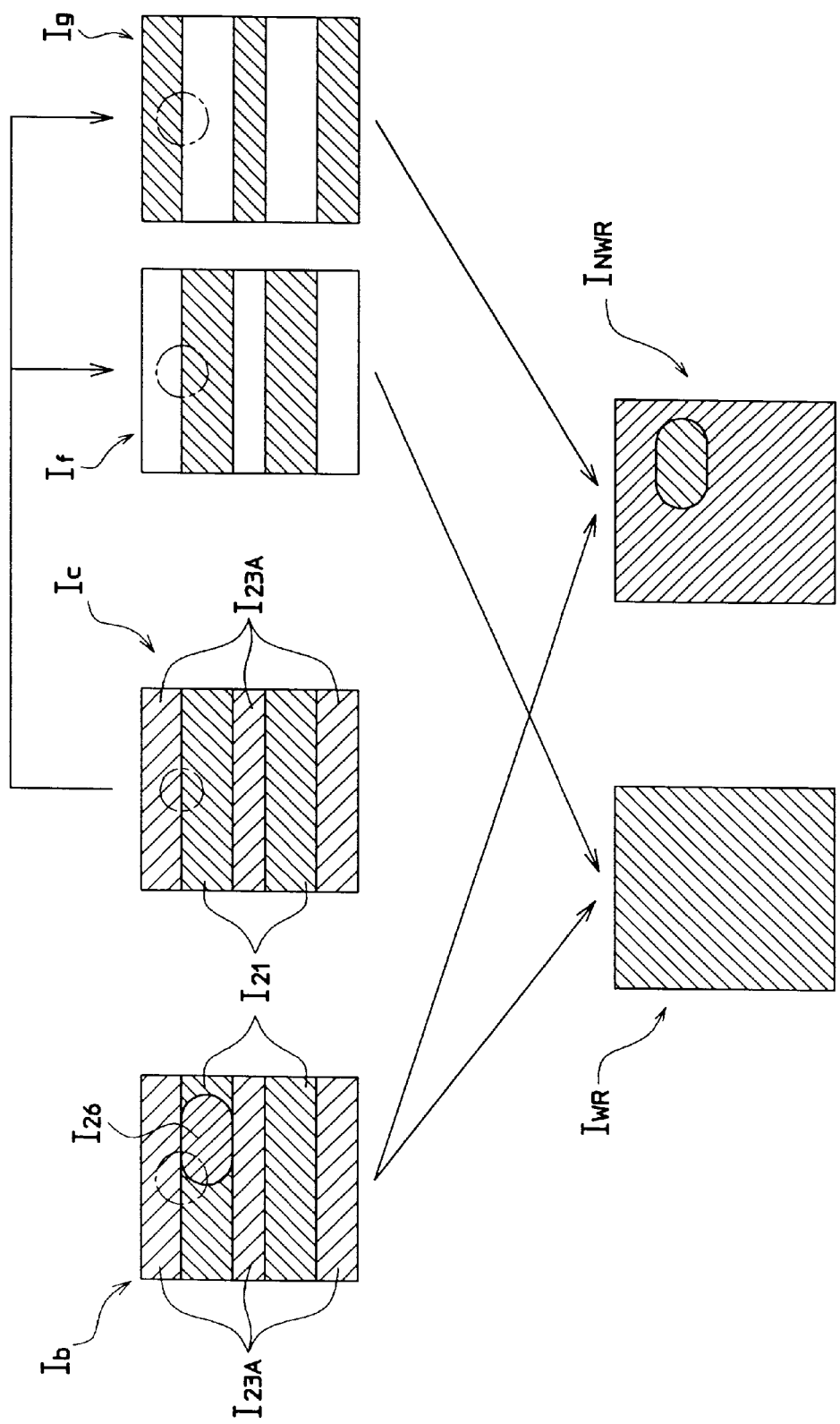
FIG. 16 is a diagram showing a modification of the defect classifying method according to the invention.

Further, by converting the density difference image $I_d$ into binary data based on a suitable threshold value and applying a basic image processing such a noise removal, the image is stored in the image memory 3e while the pixel data corresponding to the defect 28 are set to "1" and the data of the pixels other than the defect pixels are set to "0" (see FIG. 15). The thus formed defect mask image $I_e$ functions as a defect mask to be described below.

In Step S3, images $I_f$, $I_g$ representative of the wiring region WR and the non-wiring region NWR are generated separately from the defect mask. Since the procedure of generating the images $I_f$, $I_g$ are same as the above case, no description is given here.

In Step S4, a wiring mask processing is applied by the defect extraction circuit 3a1 for the wiring region, a non-wiring mask processing is applied by the defect extraction circuit 3a2 for the non-wiring region, and average luminance levels in the defect region of the extract image $I_{WR}$ obtained by the wiring mask processing and the extract image $I_{NWR}$ obtained by the non-wiring mask processing are calculated by the luminance calculation unit 3a3. The calculation results "100", "0" are output to the computer 4 as the pieces of luminance information $LI_1$, $LI_2$.

In Step S5, the calculation unit 4b of the computer 4 compares two kinds of luminance information LI1, LI2 and the classification data stored in the memory 4a, specifies the defect 28 having occurred in the production process shown in FIGS. 5A to 5D, and notifies the printer 5a and the CRT 5b that the defect 28 has occurred in the production process shown in FIGS. 5A to 5D.

As described above, the defect classifying apparatus A according to this embodiment is capable of not only determining the type of the defect, but also detecting the production process where the defect has occurred. Accordingly, the detected production process can be immediately improved so that defects will not occur.

Although the microscope 2a is employed in the image pickup device 2 in consideration of the classification of fine defects which are normally difficult to be photographed by the camera 2b, it is not necessary if the defects to be inspected are relatively large. Further, the reference image data $ID_c$ to be stored in the image memory 3c of the image processor 3 may be generated by applying image processing to the inspection image $I_b$ including the defect, or may be data of an image obtained based on design data of the wiring, or may be data of an image obtained by picking up an image of a portion of the surface of the semiconductor wafer where there is no defect.

Although the density difference image $I_d$ is obtained in the foregoing embodiment, the pieces of luminance information $LI_1$, $LI_2$ can be obtained without obtaining the density difference image $I_d$. Hereafter, this method is described with reference to FIG. 16.

First, similar to the foregoing embodiment, the inspection image $I_b$ is picked up, and the wiring and the non-wiring mask images $I_f$, $I_g$ representative of the wiring region WR and the non-wiring region NWR are generated from the prestored reference image $I_c$, respectively. The extract image $I_{WR}$ is obtained by applying the wiring mask processing directly to the inspection image $I_b$ using the wiring mask image $I_f$ and the extract image $I_{NWR}$ is obtained by applying the non-wiring mask processing directly to the inspection image $I_b$ using the non-wiring mask image $I_g$. Thereafter, average luminance levels of the extract image $I_{WR}$ obtained by the wiring mask processing and the extract image $I_{NWR}$ obtained by the non-wiring mask processing are calculated by the luminance calculation unit 3a3, and are output to the computer 4 as the pieces of luminance information $LI_1$, $LI_2$. The computer 4 classifies the type of the defect and specifies the production process where the defect has occurred by comparing the pieces of luminance information $LI_1$, $LI_2$.

The above comparison of the luminance levels in the defect region and the region including no defect (normal region) is basically necessary in order to obtain a constant luminance output regardless of variations in the illumination intensity of a device (not shown in FIG. 6) for illuminating the semiconductor wafer 1 to be inspected and a variation of the offset of the camera 2b and the A/D converter 2c of the image pickup device 2. Accordingly, if there is no likelihood of the above variations, the comparison of the luminance levels in the defect region and the normal region is not necessary. It is sufficient that an absolute value of the luminance of the defect region be processed based on an identification value for the classification preset in the computer 4.

Further, although the average luminance levels are used as the pieces of luminance information $LI_1$, $LI_2$ in the apparatus A, a total sum of the luminance levels of the entire extract images $I_{WR}$, $I_{NWR}$ or a value obtained by dividing a total sum of the luminance levels of a defect portion by an area of the defect portion may be used instead of the average values.

As known, when the camera 2b of the image pickup device 2 is a color camera, the intensities of the respective lights of red (R), green (G) and blue (B) are output. Even in the case of a black-and-white camera, the intensities of the R-, G- and B-lights can be obtained by providing a filter (not shown in FIG. 6) for permitting the lights having wavelengths of R-, G-, B-lights between the wafer 1 to be inspected and the camera 2b. Accordingly, the "luminance" in the description may be signal intensities of the R-, G-, B-signals, or a signal intensity obtained by adding those signal intensities at a suitable ratio, or a signal intensity after being converted into a black-and-white image.

Although the above description of the apparatus A is limited to the classification of the defect, the present invention is not only employed to classify the defect, but also to detect the defect. More specifically, in the case of a semiconductor wafer on which the same construction (die) repeatedly appears, a defect portion can be extracted by comparing the pieces of luminance information $LI_1$, $LI_2$ of the dies with each other. For example, when the same part of three dies is extracted by the inventive method, if the pieces of luminance information $LI_1$, $LI_2$ substantially agree within a specified tolerance, no defect is determined to exist in the test regions of the three dies. If the pieces of luminance information $LI_1$, $LI_2$ extracted from one die differ from those extracted from the remaining two dies, a defect exists in the test region of this one die.

In order to effectively employ the present invention in a semiconductor production process, a defect position information output from a defect inspection apparatus installed in most of semiconductor factories may be used. More specifically, the surface image of the semiconductor wafer 1 corresponding to this defect position is picked up, and the type of the defect is specified as described above. When an image of the semiconductor wafer 1 in a position where no defect exists is further picked up to use as a reference image, the "position including no defect" which is output from the defect inspection apparatus may be used for the image pickup operation as the position of the reference image. In other words, since the defect position and the reference image position can be both obtained from the defect inspection apparatus, the defect can be efficiently classified. In such a case, a more efficient defect classification can be made by providing a sample table (not shown in FIG. 6) for moving the semiconductor wafer 1 in X- and Y-directions and a sample table control mechanism for moving the sample table to the defect position output from the defect inspection apparatus and to the position including no defect.

Figure 17:
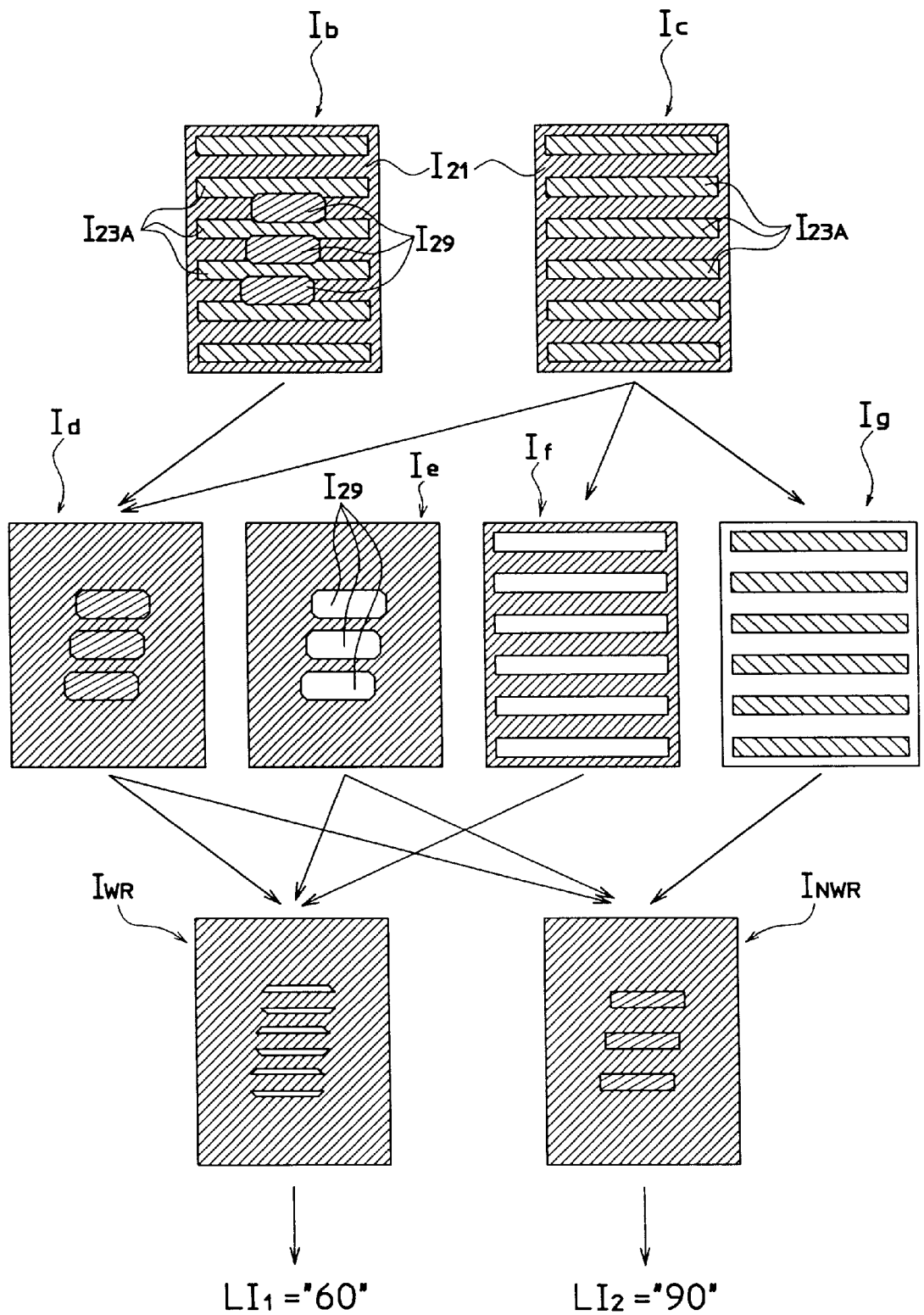
FIG. 17 is a diagram showing the operation of the apparatus of FIG. 6 when the resolving power of a microscope is low.

In the foregoing embodiment, the type of the defect is determined in cases where the defect 28 exists in the wiring region WR and the defect 26 exists in the non-wiring region NWR. If the resolving power of the microscope 2a is low in comparison to the size of a fine structure in the construction of the integrated circuit, despite the fact that a defect exists only in the non-wiring region NWR, the defect may exist in the wiring region WR in the inspection image $I_b$ as shown in FIG. 17. In such a case, the pieces of luminance information $LI_1$, $LI_2$ are "60" and "90", respectively according to the aforementioned defect classifying method and, hence, an accurate determination cannot be made.

The above problem can be solved by using a defect classifying method to be described in detail below, thereby enhancing the performance of the defect classifying apparatus.

Figure 18:
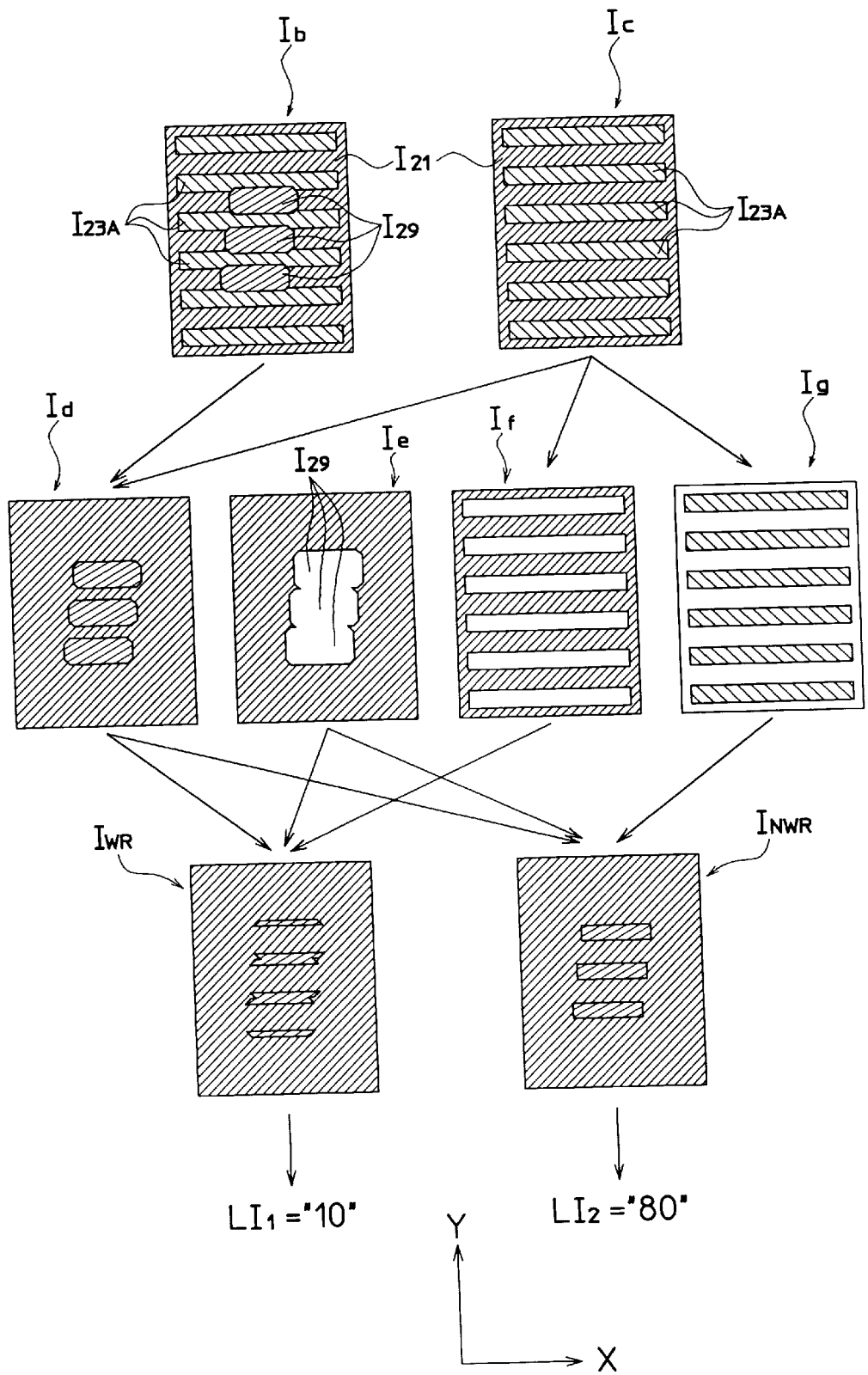
FIG. 18 is a diagram showing a defect classifying method adopted by an improvement of the defect classifying apparatus according to the invention.

FIG. 18 is a diagram showing an improvement of the defect classifying method according to the invention. This improvement method largely differs from the method according to the foregoing embodiment in the method for generating the defect mask image. Specifically, in this example, after the defect mask image is generated in the same manner as in the foregoing embodiment, images $I_{29}$ of the defect portions is expanded in a direction Y normal to an extending direction X of the wiring. This expanded image is stored as a defect mask image in the image memory. Preferably, the images $I_{29}$ of the respective defect portions are expanded to the extent that they are connected with each other.

The pieces of luminance information $LI_1$, $LI_2$ are corrected to suitable levels "10" and "80", respectively by modifying the defect mask image in the above manner, with the result that a more accurate defect classification can be made.

If neither piece of the luminance information $LI_1$, $LI_2$ is "0" as shown in FIG. 18, one luminance information may be corrected in the manner as described below. Specifically, the numbers of pixels within the defect region of the extract images $I_{WR}$, $I_{NWR}$ are obtained as areas S1, S2 and an area ratio (=S2/S1, or S1/S2) is obtained. If the area ratio is larger or smaller than a predetermined reference value, the luminance information having a smaller area may be set to "0". For example, in the case of FIG. 18, the area of the defect region having subjected to the wiring mask processing is determined to be sufficiently smaller than the area of the defect region having been subjected to the non-wiring processing, and the luminance information $LI_1$ is corrected from "60" to "0".

While the invention has been described in detail, the foregoing description is in all aspects illustrative and not restrictive. It is understood that numerous other modifications and variations can be devised without departing from the scope of the invention.

What is claimed is:

1. A method of detecting and classifying a defect on a semiconductor wafer including wiring and non-wiring regions, comprising the steps of:

providing a surface image of a semiconductor wafer having a defect as an inspection image, said surface image including images of wiring and non-wiring regions;

storing a surface image of a semiconductor wafer having no defect as a reference image;

forming a wiring mask image from said reference image, said wiring mask image being comprised of first pixel data associated with said wiring region and second pixel data associated with said non-wiring region;

forming a non-wiring mask image from said reference image, said non-wiring mask image being comprised of second pixel data associated with said wiring region and first pixel data associated with said non-wiring region;

determining first information with respect to luminance or light intensity of said wiring region from said inspection image, including extracting said defect in said wiring region based on said inspection image and said wiring mask image to form a first extract image;

determining second information with respect to luminance or light intensity of said non-wiring region from said inspection image, including extracting said defect in said non-wiring region based on said inspection image and said non-wiring mask image to form a second extract image, wherein said first information is obtained from said first extract image and said second information is obtained from said second extract image; and classifying said defect based on said first and second information.

2. A method as defined in claim 1, further comprising the steps of:

obtaining first and second areas of said defect in said first and second extract images, respectively;

comparing said first area with said second area; and correcting said information corresponding to said extract image having the smaller area to zero level.

3. A method of detecting and classifying a defect on a semiconductor wafer including wiring and non-wiring regions, comprising the steps of:

providing a surface image of a semiconductor wafer having a defect as an inspection image, said surface image including images of wiring and non-wiring regions;

storing a surface image of a semiconductor wafer having no defect as a reference image;

forming a density difference image between said inspection image and said reference image;

forming a defect mask image from said density difference image, said defect mask image being comprised of first pixel data associated with portions of said semiconductor wafer having said defect therein and second pixel data associated with other portions of said semiconductor wafer not having said defect therein;

forming a wiring mask image from said reference image, said wiring mask image being comprised of first pixel data associated with said wiring region and second pixel data associated with said non-wiring region;

forming a non-wiring mask image from said reference image, said non-wiring mask image being comprised of second pixel data associated with said wiring region and first pixel data associated with said non-wiring region;

determining first information with respect to luminance or light intensity of said wiring region from said inspection image, including extracting said defect in said wiring region based on said inspection image, said defect mask image and said wiring mask image to form a first extract image;

determining second information with respect to luminance or light intensity of said non-wiring region from said inspection image, including extracting said defect in said non-wiring region based on said inspection image, said defect mask image and said non-wiring mask image to form a second extract image, wherein said first information is obtained from said first extract image and said second information is obtained from said second extract image; and classifying said defect based on said first and second information.

4. A method as defined in claim 3, further comprising the step of expanding images corresponding to said defect within said defect mask image in a direction normal to an extending direction of said wiring region to modify said defect mask image.

5. A method as defined in claim 4, wherein said expanded images are contacted with each other.

6. A method as defined in claim 3, further comprising the steps of:

obtaining first and second areas of said defect in said first and second extract images, respectively;

comparing said first area with said second area; and correcting said information corresponding to said extract image having the smaller area to zero level.

7. An apparatus for detecting and classifying a defect on a semiconductor wafer including wiring and non-wiring regions, comprising:

means for providing a surface image of a semiconductor wafer having a defect as an inspection image, said surface image including images of said wiring and non-wiring regions;

means for determining first information with respect to luminance or light intensity of said wiring region from said inspection image;

means for determining second information with respect to luminance or light intensity of said non-wiring region from said inspection image;

means for storing a surface image of a semiconductor wafer having no defect as a reference image;

means for forming a wiring mask image from said reference image, said wiring mask image being comprised of first pixel data associated with said wiring region and second pixel data associated with said non-wiring region;

means for forming a non-wiring mask image from said reference image, said non-wiring mask image being comprised of second pixel data associated with said wiring region and first pixel data associated with said non-wiring region, wherein said first information determining means include a means for extracting said defect in said wiring region based on said inspection image and said wiring mask image to form a first extract image, and said second information determining means includes a means for extracting said defect in said non-wiring region based on said inspection image and said non-wiring mask image to form a second extract image, said first information being obtained from said first extract image and said second information being obtained from said second extract image; and means for classifying said defect based on said first and second information.

8. An apparatus as defined in claim 7, further comprising:

means for obtaining first and second areas of said defect in said first and second extract images, respectively;

means for comparing said first area with said second area; and means for correcting said information corresponding to said extract image having the smaller area to zero level.

9. An apparatus for classifying a defect on a semiconductor wafer including wiring and non-wiring regions, comprising:

means for providing a surface image of a semiconductor wafer having a defect as an inspection image, said surface image including images of said wiring and non-wiring regions;

means for determining first information with respect to luminance or light intensity of said wiring region from said inspection image;

means for determining second information with respect to luminance or light intensity of said non-wiring region from said inspection image;

means for storing a surface image of a semiconductor wafer having no defect as a reference image;

means for forming a defect mask image from said density difference image, said defect mask image being comprised of first pixel data associated with said defect and second pixel data associated with portion other than said defect;

means for forming a wiring mask image from said reference image, said wiring mask image being comprised of the first pixel data associated with said wiring region and the second pixel data associated with said non-wiring region;

means for forming a non-wiring mask image from said reference image, said non-wiring mask image being comprised of the second pixel data associated with said wiring region and the first pixel data associated with said non-wiring region, wherein said first information determining means includes a means for extracting said defect in said wiring region based on said inspection image and said wiring mask image to form a first extract image, and said second information determining means includes a means for extracting said defect in said non-wiring region based on said inspection image and said non-wiring mask image to form a second extract image, said first information being obtained from said first extract image and said second information being obtained from said second extract image; and means for classifying said defect based on said first and second information.

10. An apparatus as defined in claim 9, further comprising means for expanding images corresponding to said defect within said defect mask image in a direction normal to an extending direction of said wiring region to modify said defect mask image.

11. An apparatus as defined in claim 10, wherein said expanding means expands said expanded images so as to contact with each other.

12. An apparatus as defined in claim 9, further comprising:

means for obtaining first and second areas of said defect in said first and second extract images, respectively;

means for comparing said first area with said second area; and means for correcting said information corresponding to said extract image having the smaller area to zero level.

13. A method of classifying a defect on a semiconductor wafer including wiring and non-wiring regions, comprising the steps of:

providing a surface image of a semiconductor wafer having a defect as an inspection image, said surface image including images of said wiring and non-wiring regions;

storing a surface image of a semiconductor wafer having no defect as a reference image;

forming a density difference image between said inspection image and said reference image;

forming a defect mask image from said density difference image, said defect mask image being comprised of first data corresponding to portions of the semiconductor wafer having the defect and second data corresponding to other portions of the semiconductor wafer not having the defect;

forming a wiring mask image from said reference image, said wiring mask image being comprised of first data corresponding to the wiring region and second data corresponding to the non-wiring region;

forming a non-wiring mask image from said reference image, said wiring mask image being comprised of second data corresponding to the wiring region and first data corresponding to the non-wiring region;

determining first information with respect to luminance or light intensity of said wiring region from said inspection image, including extracting first data in the wiring region of said inspection image that agree with the first data at corresponding positions of the defect mask image to form a first extract image;

determining second information with respect to luminance or light intensity of said non-wiring region from said inspection image, including extracting first data in the non-wiring region of said inspection image that agree with the first data at corresponding positions of the defect mask image to form a second extract image, wherein the first information is obtained from said first extract image, and the second information is obtained from said second extract image; and classifying said defect based on said first and second information.

14. An apparatus for classifying a defect on a semiconductor wafer including wiring and non-wiring regions, comprising:

means for providing a surface image of a semiconductor wafer having a defect as an inspection image, said surface image including images of said wiring and non-wiring regions;

means for determining first information with respect to luminance or light intensity of said wiring region from said inspection image;

means for determining second information with respect to luminance or light intensity of said non-wiring region from said inspection image;

means for storing a surface image of a semiconductor wafer having no defect as a reference image;

means for forming a density difference image between said inspection image and said reference image;

means for forming a defect mask image from said density difference image, said defect mask image being comprised of first data corresponding to portions of the semiconductor wafer having the defect and second data corresponding to portions of the semiconductor wafer not having the defect;

means for forming a wiring mask image from said reference image, said wiring mask image being comprised of first data corresponding to the wiring region and second data corresponding to the non-wiring region;

means for forming a non-wiring mask image from said reference image, said non-wiring mask image being comprised of second data corresponding to the wiring region and first data corresponding to the non-wiring region, wherein said first information determining means includes a means for extracting first data in the wiring region of the inspection image that agree with the first data at corresponding portions of the defect mask image to form a first extract image, and said second information determining means includes a means for extracting first data in the non-wiring region of the inspection image that agree with the first data at corresponding positions of the defect mask image to form a second extract image, said first information being obtained from said first extract image and said second information being obtained from said second extract image; and means for classifying said defect based on said first and second information.

\* \* \* \* \*